United States Patent [19]

Hong

[11] Patent Number: 5,429,973
[45] Date of Patent: Jul. 4, 1995

[54] TRENCH BURIED-BIT LINE MASK ROM PROCESS

[75] Inventor: Gary Hong, Hsinchu, Taiwan

[73] Assignee: United Microelectronic, Corp., Hsinchu, Taiwan

[21] Appl. No.: 190,656

[22] Filed: Feb. 2, 1994

[51] Int. Cl.$^6$ ........................................ H01L 21/8246
[52] U.S. Cl. ................................... 437/48; 437/203; 148/DIG. 50
[58] Field of Search .................... 437/48, 52, 63, 64, 437/203; 148/DIG. 50; 257/390, 391

[56] References Cited

U.S. PATENT DOCUMENTS

| | | | |
|---|---|---|---|
| 5,021,355 | 6/1991 | Dhong et al. | 437/203 |
| 5,084,418 | 1/1992 | Esquivel et al. | 437/48 |
| 5,180,680 | 1/1993 | Yang | 437/203 |

Primary Examiner—Chandra Chaudhari
Attorney, Agent, or Firm—Omri M. Behr; Matthew J. McDonald

[57] ABSTRACT

A method for fabricating a trench buried-bit line mask ROM includes the steps: firstly, longitudinally coating a plurality of spaced photo-resist strips on a silicon well surface thus dividing the silicon well surface into a plurality of longitudinally spaced strip regions; secondly, etching into each of the silicon strip regions a predetermined depth and forming a longitudinal trench therein; thirdly, depositing a strip of N+ ions along each of the longitudinal trenches such that each strip of N+ ions constitutes a bit line of the ROM; fourthly, removing the photoresist strips from the silicon well surface and leaving a silicon ridge between each two trenches such that an inverse U-shaped channel is defined substantially along periphery of each silicon ridge; fifthly, applying a layer of oxide material to cover the trenches and the silicon ridges; and, sixthly, laterally depositing a plurality of spaced semiconductor strips on the oxide layer such that each of the lateral semiconductor strips constitutes a word line of the ROM.

5 Claims, 2 Drawing Sheets

TRENCH BURIED-BIT LINE MASK ROM PROCESS

BACKGROUND OF THE INVENTION

1. Field of the Invention

The present invention relates to a trench buriedbit line mask ROM process, and more particularly to one which forms a U-shaped channel preventing unwanted ion diffusion into bit line regions of the ROM structure.

2. Description of the Prior Art

A buried-bit line mask ROM is by far the most competitive ROM structure and the top view thereof is illustrated in FIGS. 1 and 2. In this example, a plurality of spaced word lines W/L (here only two are shown) are formed above a plurality of parallel bit lines B/L (here only two are shown) and both are separated by a nonconductive oxide layer OX. FIG. 2 is a cross-sectional view taken along a line 2—2 of FIG. 1, where a region 8 between the two adjacent bit lines B/L is defined as a channel region of a memory access transistor. Two spaced photoresist strips PR are separately formed at the top of the word line region W/L and constitute a programming window 7 therebetween. More specifically, the window 7, as highlighted with bold lines in FIG. 1, is defined above each word line region W/L which is between two adjacent bit lines B/L and substantially above the channel region 8. To block the channel region 8, i.e., to turn the memory transistor into having a relatively high threshold voltage ($V_T$) in ROM code programming, boronions B+ are implanted from the window 7, tunneling through the word line area W/L, the oxide layer OX, and doped into the channel region 8, thus increasing the threshold voltage ($V_T$) of the memory transistor, i.e., blocking the channel even for a certain word line W/L or gate voltage conduction on the transistor. However in programming the ROM, some Boron ions B+ will be diffused into the two bit line regions B/L adjacent to two sides of the channel region 8 thus resulting counter-doping effect in the bit lines B/L. This increases the resistance and the capacitance of the bit lines B/L and also decreases the junction breakdown voltage thereof thus negatively affecting the function of the ROM. More specifically, high bit-line resistance and capacitance hurt the product speed of the high density ROMs.

It is noted that each cell size in the ROM structure is mainly determined by the word line pitch and buried-bit line pitch. When the cell dimension shrinks for high density application, the buried-bit line doping needs to be reduced in order to avoid the bit-line to bit-line punch-through. This N+ doping becomes more sensitive to the counter-doping from P-type (Boron) doping for programming in the channel region.

It is requisite to provide a new method for fabricating trench buried-bit line mask ROM to solve the problems as mentioned previously.

SUMMARY OF THE INVENTION

The primary objective of the present invention is to provide a method for fabricating a trench buried-bit line mask ROM thus limiting the ROM code implantation only into a channel area between two bit line regions and not doping into the bit line regions. Therefore, the bit-line resistance and capacitance can be decreased, and bit-line junction breakdown voltage can be increased.

In accordance with one aspect of the invention, there is provided a method for fabricating a trench buried-bit line mask ROM comprising the steps:

firstly, longitudinally coating a plurality of spaced photo-resist strips on a silicon well surface thus dividing the silicon well surface into a plurality longitudinally spaced strip regions;

secondly, etching into each of the silicon strip regions a predetermined depth and forming a longitudinal trench therein;

thirdly, applying an ion implantation process on the trench thus forming a bit line of the ROM;

fourthly, removing the photo-resist strips from the silicon well surface and leaving a silicon ridge between each two trenches such that an inverse U-shaped channel is defined substantially along periphery of each silicon ridge;

fifthly, applying a layer of oxide material to cover the trenches and the silicon ridges; and sixthly, laterally depositing a plurality of spaced semiconductor strips on the oxide layer such that each of the lateral semiconductor strips constitutes a word line of the ROM.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
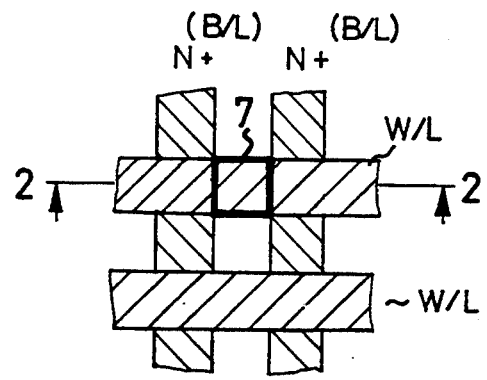
FIG. 1 is a partial top view of a ROM structure.
Figure 2:
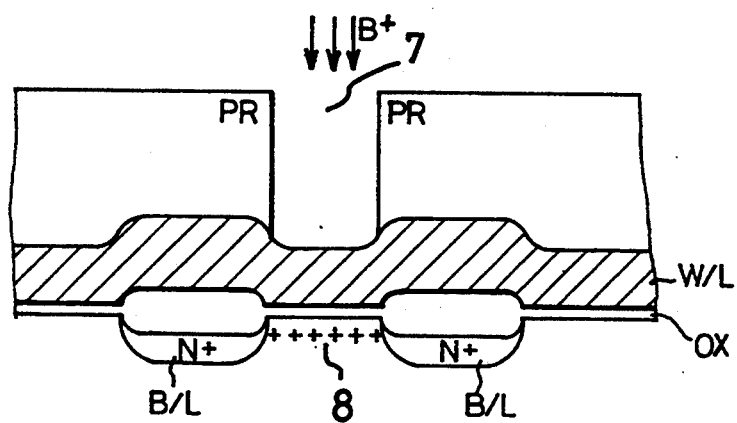
FIG. 2 is a cross-sectional view taken along a line 2—2 of FIG. 1.
Figure 3A:
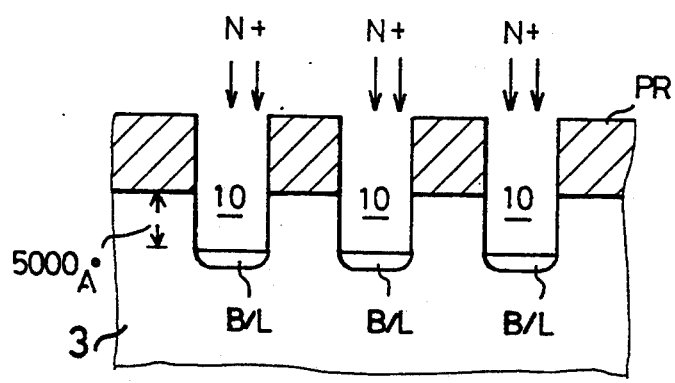
FIGS. 3A to 3C are sequential procedures for making a buried-bit line mask ROM.
Figure 3B:
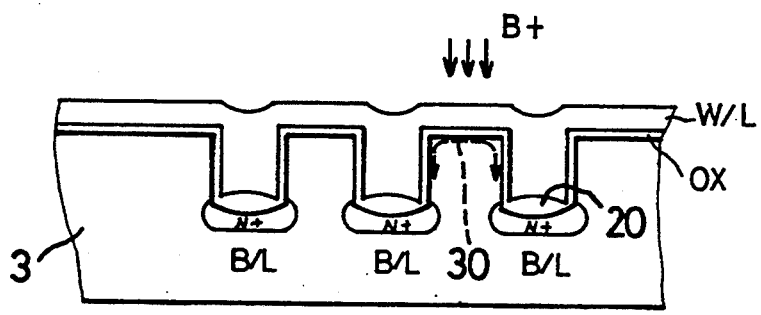
Figure 3C:
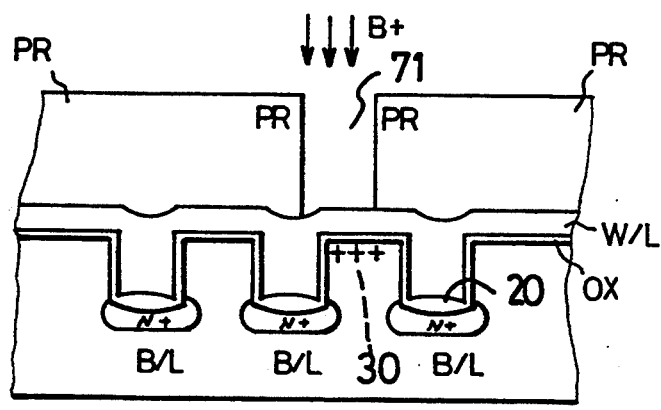

A method for fabricating a trench buried-bit line mask ROM is illustrated in FIGS. 3A to 3C. Initially referring to FIG. 3A, a masking process is realized by longitudinally coating a plurality of spaced photoresist strips PR on a silicon well 3 thus dividing the latter into a plurality of longitudinal strips. A trench etching process is applied on each longitudinal strip of the silicon well 3 and a plurality of longitudinal trenches 10 are formed thereinto. The etching depth is about 5000 Å. An ion implantation process is then applied on the trench 10 thus forming N+ bit line region B/L in each trench 10. The photoresist layers PR are then removed and a silicon ridge (not labeled) is exposed between every two adjacent trenches 10.

Referring to FIG. 3B, a gate oxide layer OX about 150 Å in thickness is thermally grown on each trench 10 and adjacent silicon ridges, wherein a relatively thick oxide layer 20 is grown on the trenched N+ bit line region B/L and a relatively thin oxide layer OX is formed on two vertical walls of the trench and also on the ridge. A plurality of spaced semiconductor strips W/L are laterally deposited on the overall surface to form a plurality of laterally spaced word lines W/L over the oxide layer OX. Each semiconductor strip W/L may utilize polysilicon or silicide such as tungsten silicide or molybdenum silicide. In this cell structure, a channel 30 which is an inverse U shape along the ridge periphery is defined between two adjacent bit line regions B/L. Since the channel 30 is reversely U-shaped and the upper flat portion of the channel 30 is not adjacent to the bit line region B/L, the implantation of the ions will hardly dope with the bit line regions B/L. More specifically, the height of the silicon ridge is substantially 5000 Å which is great enough to prevent the implanted boron ions B+ from diffusing into the bit line regions B/L.

With the above structure, the photoresist masking window is not required to face a predetermined region precisely. For example, a masking window 71 shown in FIG. 3C is formed between two photoresist layers PR and is offset by a distance from a predetermined region which is substantially above the flat portion of the inversely U-shaped channel 30. In this example, the masking window 71 is offset but the ion implantation still works because a portion of the ions will tunnel through the word line region W/L and dope into the flat portion of the U-shaped channel region 30, thus increasing the threshold voltage of the memory transistor, i.e., blocking the channel conduction for an applied word line or memory gate voltage.

As shown in FIG. 3C, the ROM code masking could be mis-aligned with the surface channel region, i.e., the flat portion of the U-shaped channel of the memory access transistor. However, by using this cell structure, the vertical channel regions, where the source/drain bit line N+ regions are directly connected, will not receive the Boron implantation. Therefore, the Boron dose (P+) will not contact N+ source/drain. Also, even if the ROM code masking has misalignment to the surface channel region, part of surface channel can still receive boron ions implanted and hence the memory access transistor can be turned off by the Boron ions. Therefore, the ROM code masking opening size and photolithography process become less critical. Since the implanted Boron ions do not contact N+ source/drain, the bit-line resistance and capacitance can be decreased, and the bit-line junction breakdown voltage can be increased.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A method for fabricating a trench buried-bit line mask ROM comprising the steps of:

firstly, longitudinally coating a plurality of spaced photoresist strips on a silicon well surface thus dividing said silicon well surface into a plurality of longitudinally spaced silicon strip regions;

secondly, etching into said silicon strip regions and forming a longitudinal trench in each of said silicon strip regions;

thirdly, applying an ion implantation process on the trench thus forming a bit line of said ROM;

fourthly, removing said photoresist strips from said silicon well surface and leaving a silicon ridge between every two adjacent trenches such that an inverse U-shaped channel is formed along a periphery of said silicon ridge;

fifthly, applying a layer of oxide material to cover the trenches and the silicon ridges; and sixthly, laterally depositing a plurality of spaced semiconductor strips on said oxide layer such that said lateral semiconductor strips constitute a word line of said ROM.

2. A method for fabricating a trench buried-bit line mask ROM as claimed in claim 1, wherein the etching depth for said trench is about 5000 Å.

3. A method for fabricating a trench buried-bit line mask ROM as claimed in claim 1, wherein said lateral semiconductor strips comprise polysilicon.

4. A method for fabricating a trench buried-bit line mask ROM as claimed in claim 1, wherein said lateral semiconductor strips comprise tungsten silicide.

5. A method for fabricating a trench buried-bit line mask ROM as claimed in claim 1, wherein said lateral semiconductor strips comprise molybdenum silicide.

* * * * *